(12) United States Patent
Chiu et al.

(10) Patent No.: US 12,087,656 B2
(45) Date of Patent: Sep. 10, 2024

(54) PACKAGE ARCHITECTURE UTILIZING WAFER TO WAFER BONDING

(71) Applicant: Qorvo US, Inc., Greensboro, NC (US)

(72) Inventors: Anthony Chiu, Richardson, TX (US);
Robert Charles Dry, Plano, TX (US);
Mihir Roy, Sachse, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/303,152

(22) Filed: Apr. 19, 2023

(65) Prior Publication Data

US 2023/0298958 A1  Sep. 21, 2023

Related U.S. Application Data

(63) Continuation of application No. 17/219,189, filed on Mar. 31, 2021, now Pat. No. 11,637,050.

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4853* (2013.01); *H01L 21/4871* (2013.01);
(Continued)

(58) Field of Classification Search
None
See application file for complete search history.

(56) References Cited

U.S. PATENT DOCUMENTS

| | | | |
|---|---|---|---|
| 4,561,011 A | 12/1985 | Kohara et al. | |
| 5,604,978 A | 2/1997 | Sherif et al. | |
| (Continued) | | | |

FOREIGN PATENT DOCUMENTS

| | | |
|---|---|---|
| CN | 111293108 A | 6/2020 |
| DE | 102010041143 A1 | 3/2012 |
| (Continued) | | |

OTHER PUBLICATIONS

Di Cioccio, L. et al., "Direct bonding for wafer level 3D integration," IEEE International Conference on Integrated Circuit Design and Technology (ICICDT), Jun. 2-4, 2010, Grenoble, France, 4 pages.

(Continued)

*Primary Examiner* — Telly D Green
(74) *Attorney, Agent, or Firm* — Withrow & Terranova, P.L.L.C.

(57) ABSTRACT

The present disclosure relates to a package architecture and a method for making the same. The disclosed package architecture includes a package carrier, a first device die and a second device die mounted on the package carrier, and a heat spreader. The first device die includes a first device body with a thickness between 5 μm and 130 μm, a die carrier, and an attachment section between the first device body and the die carrier, while the second device die includes a second device body. The first device body and the second device body are formed of different materials. A top surface of the die carrier of the first device die and a top surface of the second device body of the second device die are substantially coplanar. The heat spreader resides over the top surface of the die carrier and the top surface of the second device body.

23 Claims, 10 Drawing Sheets

(51) Int. Cl.
  *H01L 21/56* (2006.01)
  *H01L 21/78* (2006.01)
  *H01L 23/00* (2006.01)
  *H01L 23/31* (2006.01)
  *H01L 25/07* (2006.01)

(52) U.S. Cl.
  CPC .......... *H01L 21/563* (2013.01); *H01L 21/565* (2013.01); *H01L 21/78* (2013.01); *H01L 23/3121* (2013.01); *H01L 23/3135* (2013.01); *H01L 24/16* (2013.01); *H01L 25/072* (2013.01); *H01L 2224/16225* (2013.01); *H01L 2924/10253* (2013.01); *H01L 2924/10329* (2013.01); *H01L 2924/1033* (2013.01); *H01L 2924/18161* (2013.01)

(56) References Cited

U.S. PATENT DOCUMENTS

| | | |
|---|---|---|
| 5,981,310 A | 11/1999 | DiGiacomo et al. |
| 7,031,162 B2 | 4/2006 | Arvelo et al. |
| 8,202,765 B2 | 6/2012 | Casey et al. |
| 8,421,217 B2 | 4/2013 | Casey et al. |
| 9,595,506 B2 | 3/2017 | Chen et al. |
| 10,199,302 B1 | 2/2019 | Sanchez et al. |
| 11,637,050 B2 | 4/2023 | Chiu et al. |
| 2004/0178494 A1 | 9/2004 | Lin et al. |
| 2005/0068739 A1 | 3/2005 | Arvelo et al. |
| 2006/0261469 A1 | 11/2006 | Ni et al. |
| 2008/0142954 A1 | 6/2008 | Hu |
| 2008/0315409 A1 | 12/2008 | Cordes et al. |
| 2009/0219698 A1 | 9/2009 | Chao |
| 2009/0244867 A1 | 10/2009 | Bahadur et al. |
| 2010/0181665 A1 | 7/2010 | Casey et al. |
| 2012/0175766 A1 | 7/2012 | Casey et al. |
| 2014/0061893 A1 | 3/2014 | Saeidi et al. |
| 2014/0264800 A1 | 9/2014 | Gowda et al. |
| 2016/0133602 A1 | 5/2016 | Chen et al. |
| 2017/0162542 A1 | 6/2017 | Chen et al. |
| 2019/0221524 A1 | 7/2019 | Bruzda et al. |
| 2020/0144155 A1 | 5/2020 | Yeh et al. |

FOREIGN PATENT DOCUMENTS

| | | |
|---|---|---|
| KR | 20110124560 A | 11/2011 |
| TW | 201735291 A | 10/2017 |
| WO | 2017123188 A1 | 7/2017 |

OTHER PUBLICATIONS

Pristauz, H. et al., "Disruptive Developments for Advanced Die Attach to Tackle the Challenges of Heterogeneous Integration," IEEE 68th Electronic Components and Technology Conference, May 2018, San Diego, CA, 8 pages.

Wolffenbuttel, R.F. et al., "Low-temperature silicon wafer-to-wafer bonding using gold at eutectic temperature," Sensors and Actuators A: Physical, vol. 43, Issue 1-3, 1994, Elsevier Science S.A., pp. 223-229.

Non-Final Office Action for U.S. Appl. No. 17/219,189, mailed Jul. 28, 2022, 14 pages.

Final Office Action for U.S. Appl. No. 17/219,189, mailed Sep. 2, 2022, 23 pages.

Notice of Allowance for U.S. Appl. No. 17/219,189, mailed Nov. 29, 2022, 8 pages.

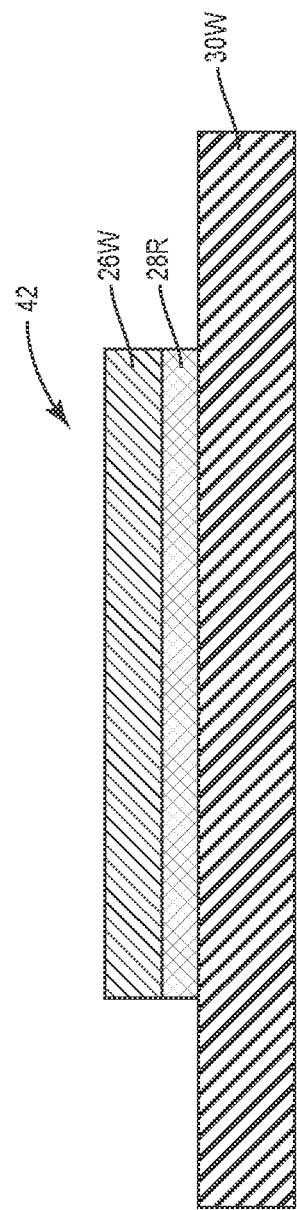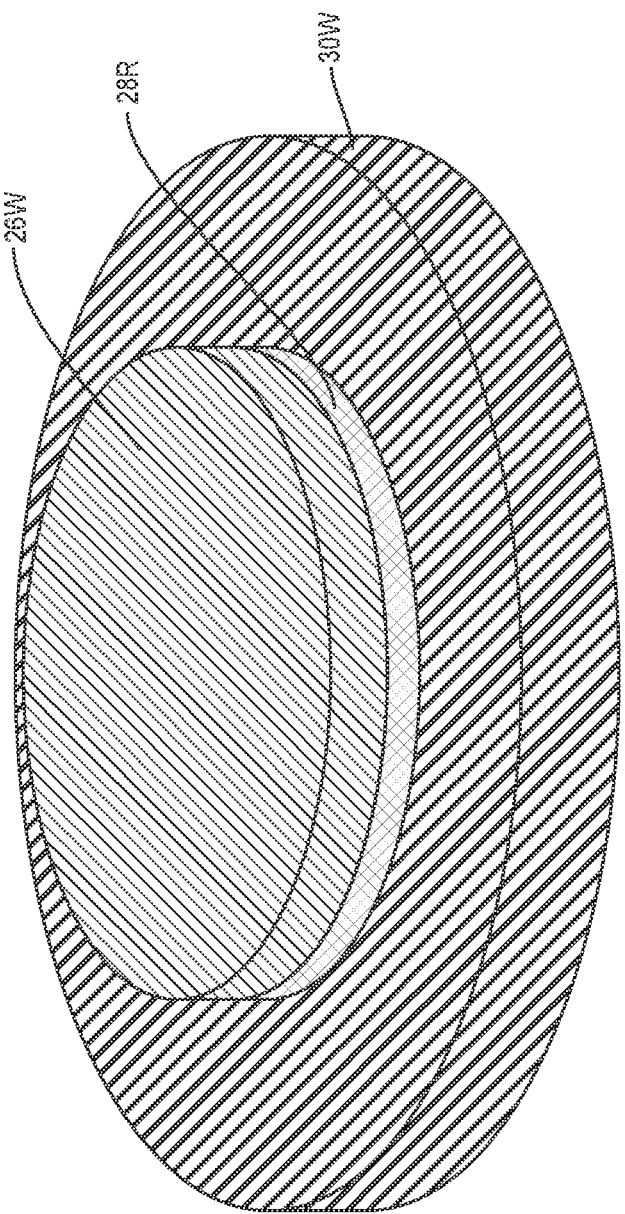

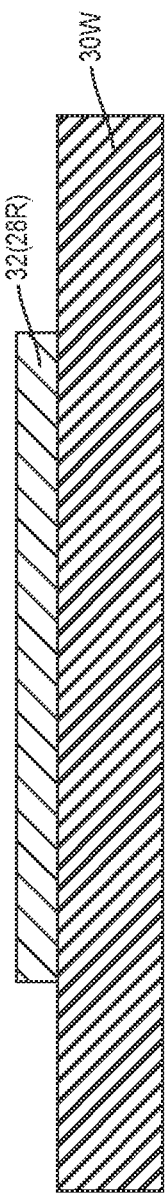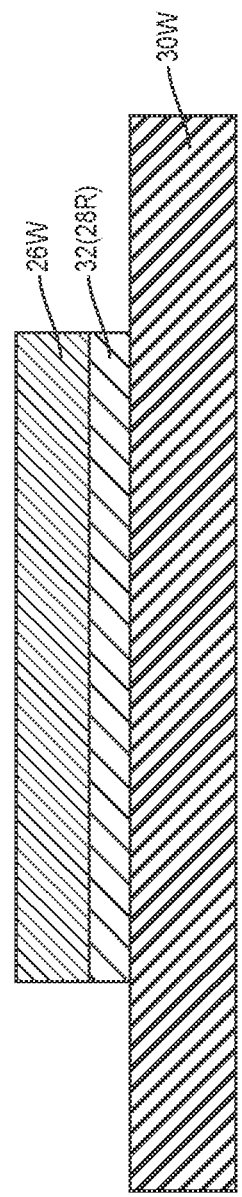

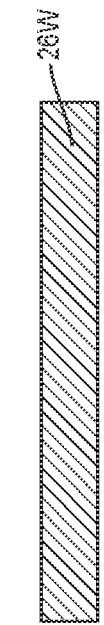
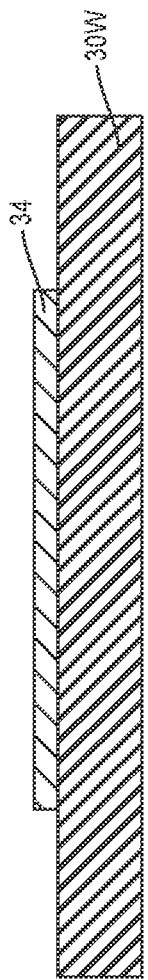
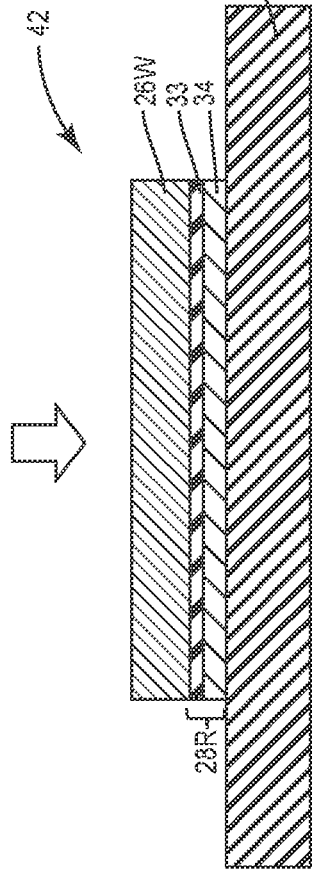

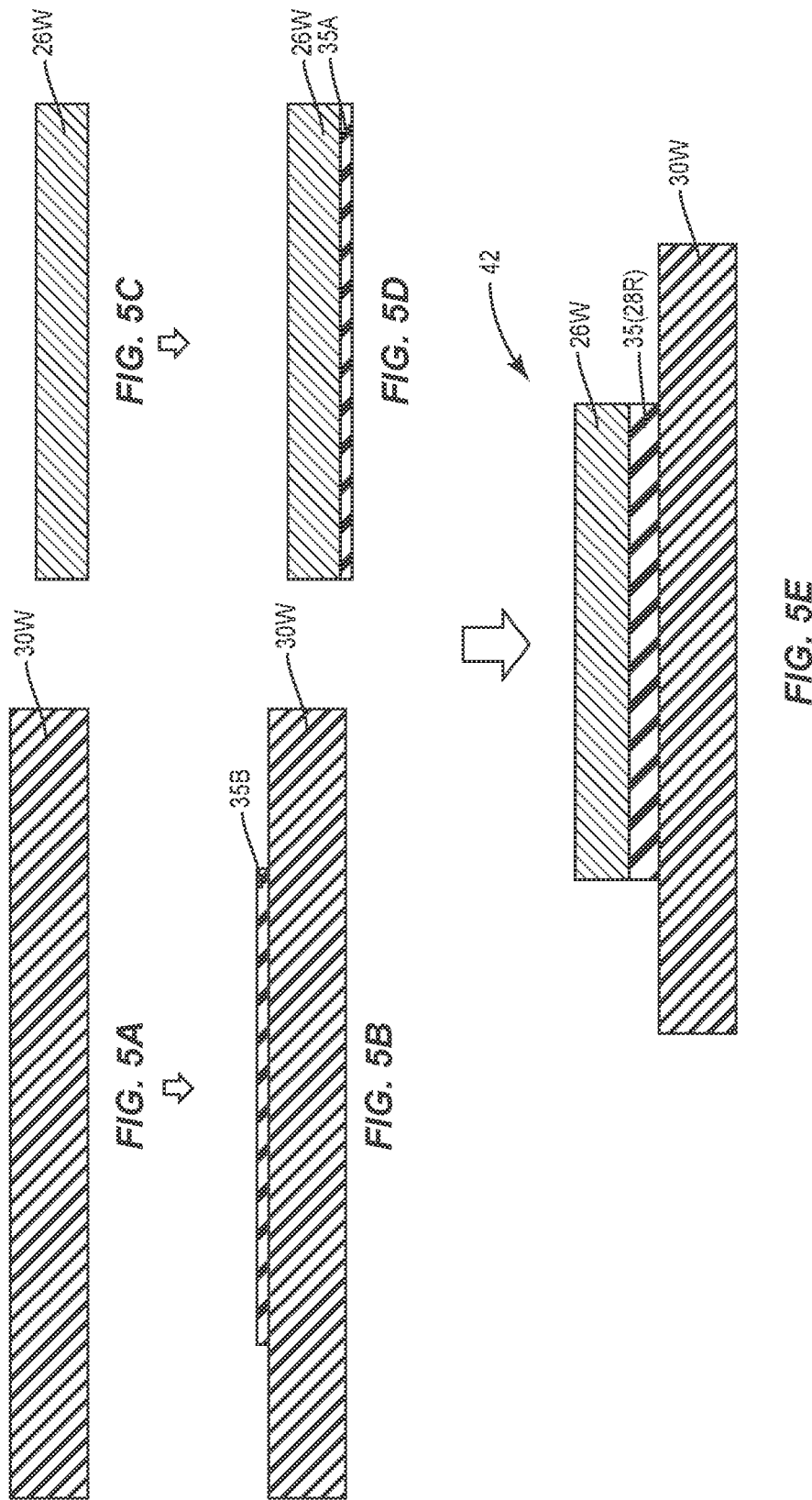

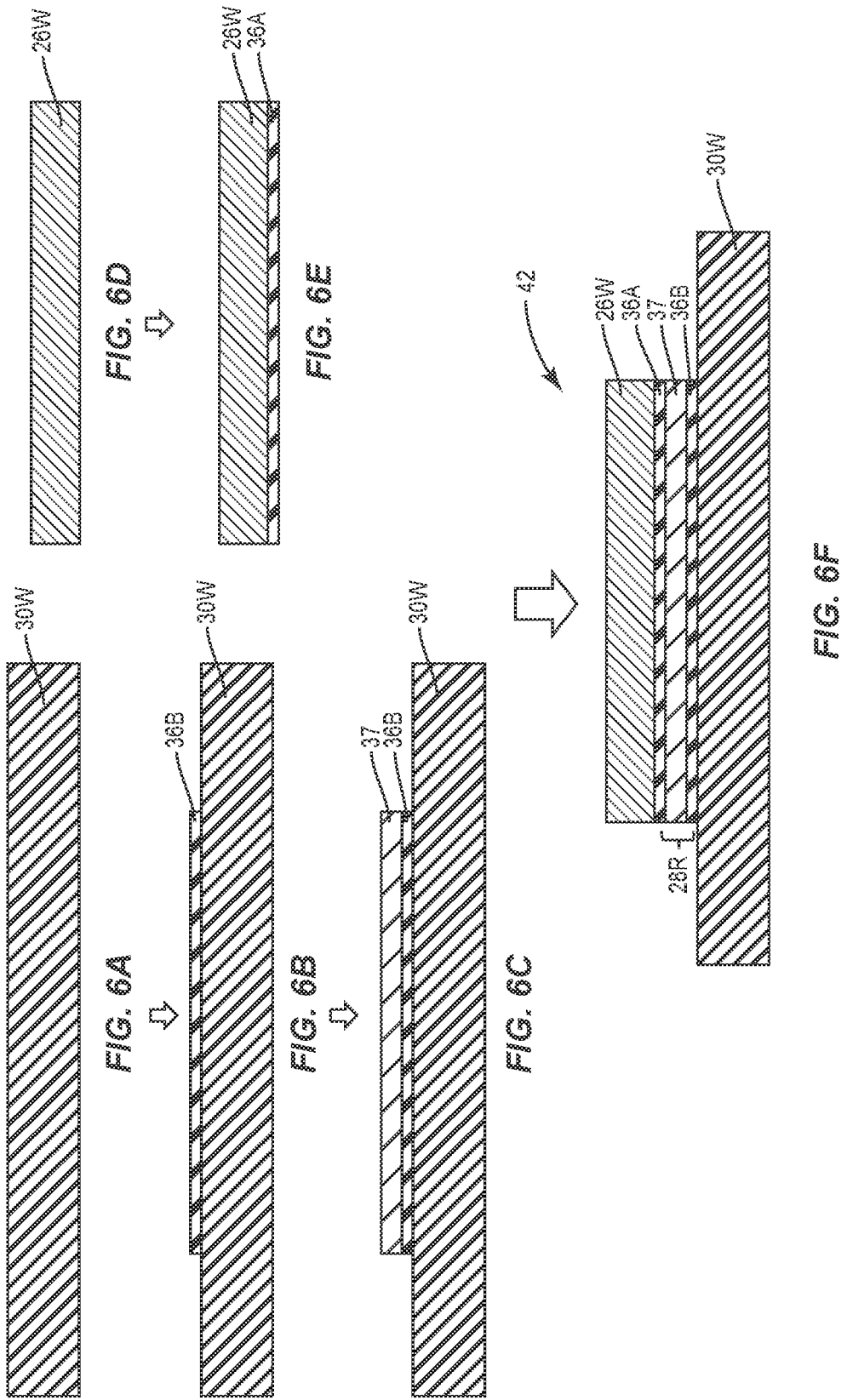

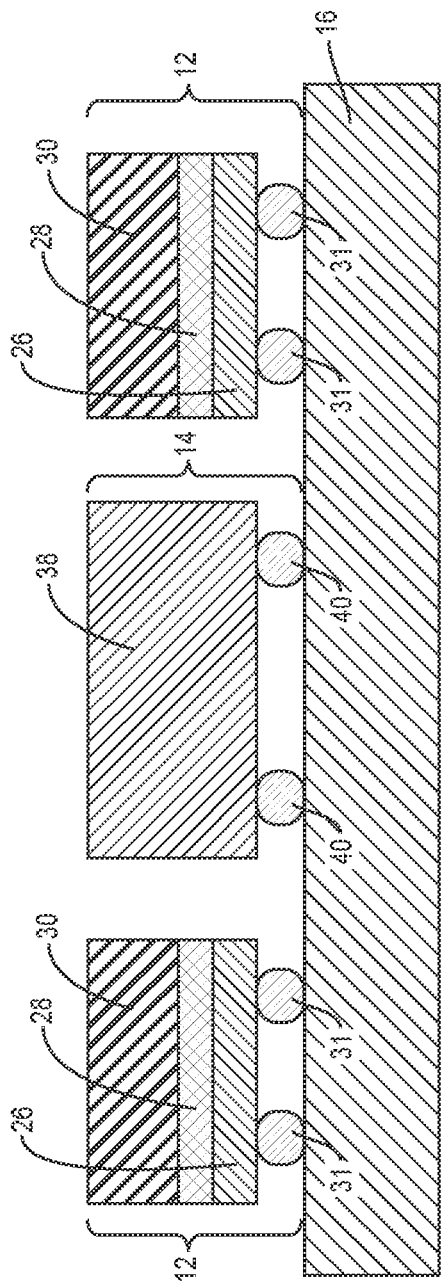
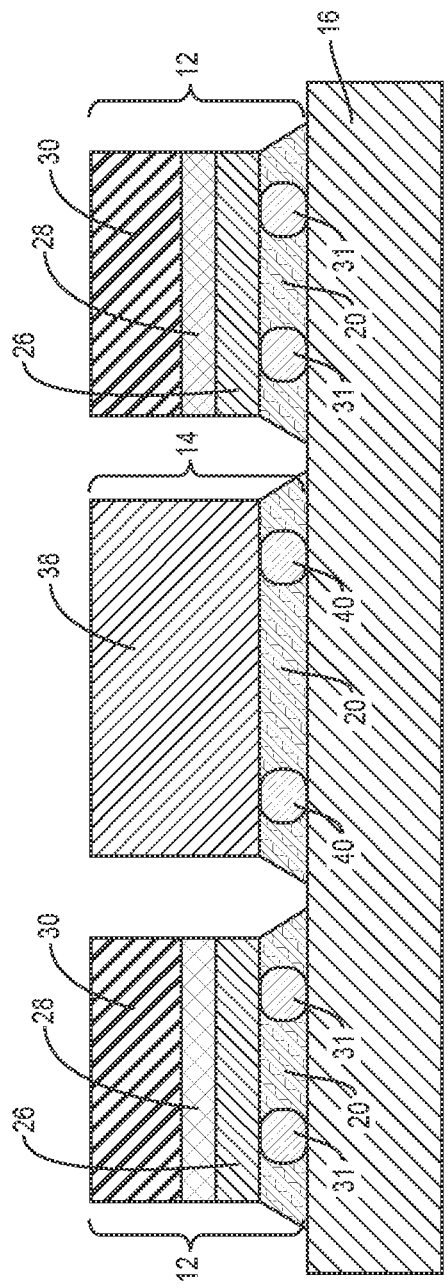

PACKAGE ARCHITECTURE UTILIZING WAFER TO WAFER BONDING

RELATED APPLICATIONS

This application is a continuation of U.S. patent application Ser. No. 17/219,189, filed Mar. 31, 2021, now U.S. Pat. No. 11,637,050, the disclosure of which is hereby incorporated herein by reference in its entirety.

FIELD OF THE DISCLOSURE

The present disclosure relates to a package architecture and a method for making the same, and more particularly to a package architecture with enhanced mechanical robustness and thermal performance, and a method with a wafer to wafer bonding process to provide the package architecture.

BACKGROUND

The wide utilization of cellular and wireless devices drives the rapid development of radio frequency (RF) technologies. III-V components, such as gallium arsenide (GaAs) and gallium nitride (GaN), have higher carrier mobility than silicon material and may be utilized to form ultimate high frequency devices. For instance, amplifiers made from III-V materials usually outperform silicon devices in terms of power, linearity, and speed.

Within a package, to reduce cost and increase operating frequency, complementary metal oxide semiconductor (CMOS) and III-V devices may use similar techniques to shrink the size of the transistors. For III-V devices, there is also a requirement to shrink passive circuits, such as transmission lines, inductors, and capacitors. These passive circuits take up a large amount of die surface areas, usually >50%. In order to shrink these passive circuits and retain circuit performance (i.e., retain matching impedance of the transmission lines on the die surface), the thickness of the III-V devices has to be thinned. However, such thinned III-V devices or III-V wafers are difficult to process and/or package due to mechanical handling damages. Accordingly, it is therefore an object of the present disclosure to provide a solution, which enhances mechanical robustness of the III-V devices during packaging processes (like wafer bumping, wafer dicing, die attaching, die underfilling, and/or molding) without sacrificing operating frequency or thermal performance of the III-V devices.

SUMMARY

The present disclosure relates to a package architecture with enhanced mechanical robustness and thermal performance, and a method with a wafer to wafer bonding process to provide the package architecture. The disclosed package architecture includes a package carrier with a top surface, a first device die mounted on the top surface of the package carrier, a second device die mounted on the top surface of the package carrier, and a heat spreader. In detail, the first device die includes a first device body with a thickness between 5 μm and 130 μm, an attachment section over the first device body, and a die carrier over the attachment section. The second device die includes a second device body. Herein, a top surface of the die carrier of the first device die and a top surface of the second device body of the second device die are substantially coplanar. The heat spreader resides over the top surface of the die carrier and the top surface of the second device body.

In one embodiment of the package architecture, the die carrier has a thickness between 100 μm and 300 μm.

In one embodiment of the package architecture, the second device body has a thickness between 125 μm and 350 μm.

In one embodiment of the package architecture, the first device body and the second device body include different materials.

In one embodiment of the package architecture, the die carrier of the first device die is formed of silicon, silicon carbide, silicon nitride, copper, aluminum, aluminum nitride, steel, or Kovar. The first device body includes a III-V material, and the second device body includes silicon.

In one embodiment of the package architecture, the first device body comprises gallium arsenide or gallium nitride.

In one embodiment of the package architecture, the die carrier of the first device die is formed of silicon.

In one embodiment of the package architecture, the first device die and the second device die have a same height between 125 μm and 600 μm.

In one embodiment of the package architecture, the first device die and the second device die have a same height between 125 μm and 350 μm.

In one embodiment of the package architecture, the first device die includes a number of first bumps that are underneath the first device body and connected to the top surface of the package carrier, and the second device die includes a number of second bumps that are underneath the second device body and connected to the top surface of the package carrier.

According to one embodiment, the package architecture further includes a mold compound, which resides over the top surface of the package carrier and encapsulates at least sides of the first device die and sides of the second device die. Herein, a top surface of the mold compound, the top surface of the die carrier of the first device die, and the top surface of the second device body of the second device die are substantially coplanar.

According to one embodiment, the package architecture further includes an underfilling material, which encapsulates the first bumps and the second bumps, and fills gaps between a bottom surface of the first device body and the top surface of the package carrier and between a bottom surface of the second device body and the top surface of the package carrier.

According to one embodiment, the package architecture further includes a thermal interface layer formed over the top surface of the mold compound, over the top surface of the die carrier of the first device die, over the top surface of the second device body of the second device die, and underneath the heat spreader.

In one embodiment of the package architecture, the heat spreader is formed of copper, aluminum, or silver diamond.

In one embodiment of the package architecture, the attachment section includes an epoxy layer between the first device body and the die carrier. The epoxy layer has a thickness between 25 μm and 75 μm.

In one embodiment of the package architecture, the attachment section includes a first metal layer over the first device body, and an epoxy layer between the first metal layer and the die carrier. Herein, the first metal layer is formed of gold or copper with a thickness between 0.5 μm and 3 μm, and the epoxy layer has a thickness between 25 μm and 75 μm.

In one embodiment of the package architecture, the attachment section includes a metal layer between the first device body and the die carrier. Herein, the metal layer is formed of gold with a thickness between 0.5 µm and 6 µm.

In one embodiment of the package architecture, the attachment section includes a first metal layer over the first device body, an adhesive layer over the first metal layer, and a second metal layer between the adhesive layer and the die carrier. Herein, the first metal layer is formed of gold with a thickness between 0.5 µm and 3 µm, the second metal layer is formed of gold with a thickness between 0.5 µm and 3 µm, and the adhesive layer is formed of gold tin with a thickness between 25 µm and 75 µm.

According to an exemplary process, a precursor wafer structure, which includes a device wafer with a thickness between 5 µm and 130 µm, a carrier wafer, an attachment region between the device wafer and the carrier wafer, and first bumps connected to the device wafer, is firstly provided. The first bumps and the carrier wafer are located on opposite surfaces of the device wafer. Next, the precursor wafer structure is singulated into a number of first device dies, each of which includes a first device body, a die carrier, an attachment section between the first device body and the die carrier, and a number of the first bumps. Herein, each first device body is formed by the device wafer singulation, each die carrier is formed by the carrier wafer singulation, and each attachment section is formed by the attachment region singulation. At least one first device die and a second device die are then mounted on a top surface of a package carrier. Each first bump is connected to the top surface of the package carrier, the first device body resides over the first bumps, the attachment section resides over the first device body, and the die carrier resides over the attachment section. The second device die includes a second device body and a number of second bumps that are underneath the second device body and connected to the top surface of the package carrier. A mold compound is applied over the top surface of the package carrier to encapsulate the at least one first device die and the second device die. The mold compound is thinned down to expose both the die carrier of the at least one first device die and the second device body of the second device die, such that, after thinning, a top surface of the die carrier, a top surface of the second device body, and a top surface of the mold compound are substantially coplanar.

According to one embodiment, the exemplary process further includes applying a heat spreader over the top surface of the die carrier, over the top surface of the second device body, and over the top surface of the mold compound.

In one embodiment of the exemplary process, the heat spreader is formed of copper, aluminum, or silver diamond.

According to one embodiment, the exemplary process further includes, before applying the heat spreader, applying a thermal interface layer over the top surface of the die carrier, over the top surface of the second device body, and over the top surface of the mold compound. Herein, the heat spreader is applied over the thermal interface layer.

According to one embodiment, the exemplary process further includes, before applying the mold compound, applying an underfilling material to encapsulate the first bumps and the second bumps, and to fill gaps between the first device body and the top surface of the package carrier and between the second device body and the top surface of the package carrier.

In one embodiment of the exemplary process, the carrier wafer has a thickness between 100 µm and 300 µm.

In one embodiment of the exemplary process, the device wafer and the second device body comprise different materials.

In one embodiment of the exemplary process, the carrier wafer is formed of silicon, copper, aluminum, or aluminum nitride, the device wafer includes a III-V material, and the second device body includes silicon.

In one embodiment of the exemplary process, the device wafer comprises gallium arsenide or gallium nitride.

In one embodiment of the exemplary process, thinning the mold compound down is provided by a mechanical grinding process.

In one embodiment of the exemplary process, the carrier wafer is formed of silicon, the device wafer includes a III-V material, and the second device body includes silicon.

In one embodiment of the exemplary process, providing the precursor wafer structure includes providing the carrier wafer, forming the attachment region over the carrier wafer, attaching the device wafer to the carrier wafer via the attachment region. Herein, the attachment region includes an epoxy layer with a thickness between 25 µm and 75 µm. At last, the first bumps are formed over the device wafer, such that the first bumps and the epoxy layer are located on the opposite surfaces of the device wafer.

In one embodiment of the exemplary process, forming the epoxy layer is provided by an epoxy screening process. Attaching the device wafer to the carrier wafer is provided by a vacuum attach process to remove air trapped between the device wafer and the epoxy layer, and a pressure and heat process to cure the epoxy layer.

In one embodiment of the exemplary process, providing the precursor wafer structure includes providing the device wafer, forming a metal layer underneath the device wafer, providing the carrier wafer, forming an epoxy layer over the carrier wafer, and connecting the metal layer to the epoxy layer, such that the device wafer is attached to the carrier wafer. Herein, the metal layer and the epoxy layer form the attachment region. At last, the first bumps are formed over the device wafer, such that the first bumps and the metal layer are located on the opposite surfaces of the device wafer.

In one embodiment of the exemplary process, forming the metal layer is provided by a metallization process, and forming the epoxy layer is provided by an epoxy screening process. In addition, connecting the metal layer to the epoxy layer is provided by a vacuum attach process to remove air trapped between the metal layer and the epoxy layer, and a pressure and heat process to cure the epoxy layer.

In one embodiment of the exemplary process, the metal layer is formed of gold or copper with a thickness between 0.5 µm and 3 µm, and the epoxy layer has a thickness between 25 µm and 75 µm.

In one embodiment of the exemplary process, providing the precursor wafer structure includes providing the device wafer, forming a first metal layer underneath the device wafer, providing the carrier wafer, forming a second metal layer over the carrier wafer, and connecting the first metal layer to the second metal layer, such that the device wafer is attached to the carrier wafer. Herein, the first metal layer and the second metal layer merge into one metal layer to form the attachment region. At last, the first bumps are formed over the device wafer, such that the first bumps and the metal layer are located on the opposite surfaces of the device wafer.

In one embodiment of the exemplary process, forming the first metal layer is provided by a metallization process, forming the second metal layer is provided by another metallization process, and connecting the first metal layer to the second metal layer is provided by a diffusion bonding process.

In one embodiment of the exemplary process, the first metal layer is formed of gold with a thickness between 0.25 µm and 3 µm, and the second metal layer has a thickness between 0.25 µm and 3 µm.

In one embodiment of the exemplary process, providing the precursor wafer structure includes providing the device wafer, forming a first metal layer underneath the device wafer, providing the carrier wafer, forming a second metal layer over the carrier wafer, applying an adhesive layer over the second metal layer, and connecting the first metal layer, the adhesive layer, and the second metal layer together, such that the device wafer is attached to the carrier wafer. Herein, the first metal layer, the adhesive layer, and the second metal layer form the attachment region. At last, the first bumps are formed over the device wafer, such that the first bumps and the first metal layer are located on the opposite surfaces of the device wafer.

In one embodiment of the exemplary process, forming the first metal layer is provided by a metallization process, forming the second metal layer is provided by another metallization process, and connecting the first metal layer to the adhesive layer is provided by a vacuum reflow process.

In one embodiment of the exemplary process, the first metal layer is formed of gold with a thickness between 0.5 µm and 3 µm, the second metal layer is formed of gold with a thickness between 0.5 µm and 3 µm, and the adhesive layer is formed of gold tin with a thickness between 25 µm and 75 µm.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A-2B show an exemplary combined wafer provided for forming the package architecture.

FIGS. 3A-6F show multiple exemplary wafer-level fabricating processes, each of which illustrates steps to provide the exemplary combined wafer shown in FIG. 2A.

FIGS. 7-14 show an exemplary fabricating and packaging process that illustrates steps to provide the exemplary package architecture shown in FIG. 1.

Figure 1:
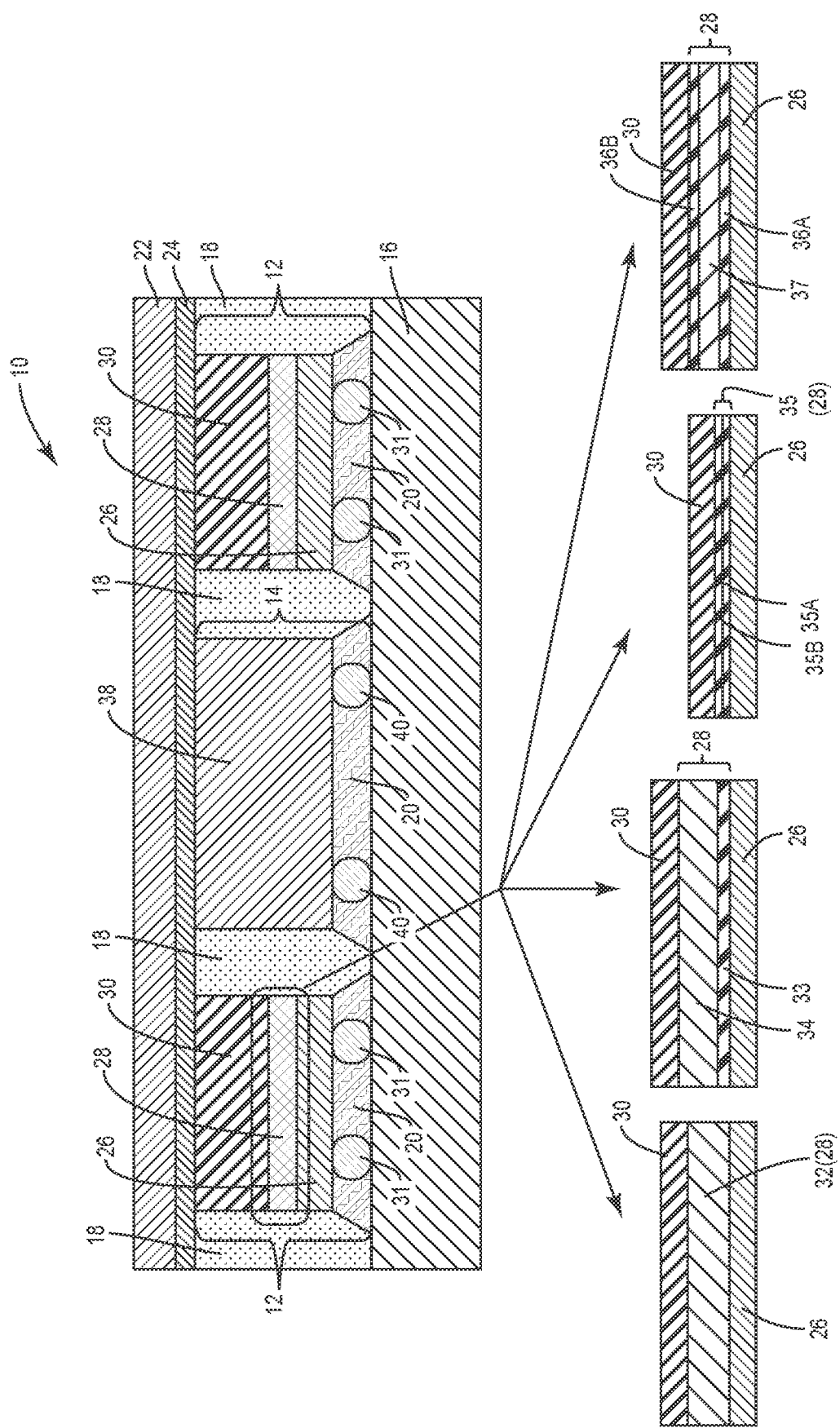
FIG. 1 shows an exemplary package architecture with enhanced mechanical robustness and thermal performance according to one embodiment of the present disclosure.

It will be understood that for clear illustrations, FIGS. 1-14 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows an exemplary package architecture 10 with enhanced mechanical robustness and thermal performance according to one embodiment of the present disclosure. For the purpose of this illustration, the package architecture 10 includes two first device dies 12, one second device die 14, a package carrier 16, a mold compound 18, an underfilling material 20, a heat spreader 22, and a thermal interface layer 24. The first device dies 12 and the second device die 14 are mounted on a top surface of the package carrier 16. The mold compound 18 resides over the top surface of the package carrier 16 and encapsulates at least sides of each first device die 12 and sides of the second device die 14. The heat spreader 22 is attached to the first device dies 12 and the second device die 14 via the thermal interface layer 24. In different applications, the package architecture 10 may include more or fewer first device dies 12, and more or fewer second device dies 14. For instance, the package architecture 10 may only include one first device die 12 and omit the second device die 14.

In detail, each first device die 12 includes a first device body 26, an attachment section 28 over the first device body 26, a die carrier 30 over the attachment section 28, and a number of first bumps 31 underneath the first device body 26. As such, a top surface of each first device die 12 is a top surface of the die carrier 30. A height of each first device die 12 may be between 125 µm and 350 µm, or extreme case not exceeding 600 µm. The first device body 26 includes one or more device components (not shown, such as a diode, a transistor, transmission line(s), a capacitor, a resistor, and/or an inductor) and may be formed on a III-V material, such as gallium arsenide or gallium nitride. The die carrier 30 may be formed of silicon, silicon nitride, silicon carbide, copper, aluminum, aluminum nitride, steel, or Kovar. The first device body 26 may have a thickness as thin as 5 µm, may be between 5 µm and 130 µm or between 5 µm and 100 µm. The first device body 26 is significant thinner than most commercial products that have a thickness over 150 µm without the use of a die carrier. The die carrier 30 may have a thickness between 100 µm and 300 µm. The first bumps 31 may be solder balls and are connected to the top surface of the package carrier 16. In some applications, the first bumps 31 may be replaced by redistribution layers (not shown).

In one embodiment, e.g. for a low power application, the attachment section 28 includes an epoxy layer 32 (may be conductive) between the first device body 26 and the die carrier 30, where the epoxy layer 32 may have a thickness between 25 µm and 75 µm. In one embodiment, the attachment section 28 includes a metal layer 33 over the first device body 26, and an epoxy layer 34 between the metal layer 33 and the die carrier 30. Herein, the metal layer 33 may be formed of gold or copper with a thickness between 0.5 µm and 3 µm, and the epoxy layer 34 may have a thickness between 25 µm and 75 µm. In one embodiment, the attachment section 28 includes a metal layer 35 (which is formed from a first metal layer 35A and a second metal layer 35B, described in the following paragraphs) between the first device body 26 and the die carrier 30, where the metal layer 35 may be formed of gold with a thickness between 0.5 µm and 6 µm. In one embodiment, e.g. for a high stress application, in which the coefficient of thermal expansion (CTE) between the first device body 26 and the die carrier 30 are vastly different, the attachment section 28 includes a first metal layer 36A over the first device body 26, an adhesive layer 37 over the first metal layer 36A, and a second metal layer 36B between the adhesive layer 37 and the die carrier 30. Herein, the first metal layer 36A may be formed of gold with a thickness between 0.5 µm and 3 µm, the second metal layer 36B may be formed of gold with a thickness between 0.5 µm and 3 µm, and the adhesive layer 37 may be formed of gold tin (e.g., 80% gold and 20% tin) with a thickness between 25 µm and 75 µm.

The second device die 14 includes a second device body 38 and a number of second bumps 40 that are underneath the second device body 38. As such, a top surface of the second device die 14 is a top surface of the second device body 38. A height of the second device die 14 may be between 125 µm and 350 µm, or extreme case not exceeding 600 µm. The second device body 38 includes one or more device components (not shown, such as a diode, a transistor, transmission line(s), a capacitor, a resistor, and/or an inductor) and may be formed of silicon. Typically, the first device body 26 of each first device die 12 and the second device body 38 of the second device die 14 include different materials. The second device body 38 may have a thickness between 125 µm and 350 µm typically, which is relatively thicker than the first device body 26 of the first device die 12. The second bumps 40 may be solder balls and are connected to the top surface of the package carrier 16. The second bumps 40 are usually taller than the first bumps 31, thereby, the die carrier 30 is needed to make up for the difference in height between the first device body 26 and the second device body 38, and to make up for the difference in height between the first bump 31 and the second bump 40. In some applications, the second bumps 40 may be replaced by redistribution layers (not shown).

The mold compound 18 resides over the top surface of the package carrier 16 and encapsulates at least the sides of each first device die 12 and the sides of the second device die 14. A top surface of the mold compound 18, the top surface of each first device die 12, and the top surface of the second device die 14 are substantially coplanar, which means that the top surface of the mold compound 18, the top surface of each first device die 12, and the top surface of the second device die 14 have a roughness tolerance less than 30 µm. The mold compound 18 may be an organic epoxy resin system or the like.

The underfilling material 20 encapsulates the first bumps 31 and the second bumps 40, and fills a gap between a bottom surface of the first device body 26 of each first device die 12 and the top surface of the package carrier 16 and a gap between a bottom surface of the second device body 38 of the second device die 14 and the top surface of the package carrier 16. The underfilling material 20 may be formed of a same or different material as the mold compound 18. In some applications, the underfilling material 20 is omitted in the package architecture 10. Instead, the mold compound 18 fills the gap between the bottom surface of the first device body 26 and the top surface of the package carrier 16 and the gap between the bottom surface of the second device body 38 and the top surface of the package carrier 16. In some applications, if the first bumps 31 and the second bumps 40 are omitted (e.g. replaced by the redistribution layers), there is no underfilling material 20 needed.

The thermal interface layer 24 is formed over the top surface of the mold compound 18, over the top surface of the die carrier 30 of each first device die 12, and over the top surface of the second device body 38 of the second device die 14. The thermal interface layer 24 may further planarize the level difference among the top surface of the mold compound 18, the top surface of the die carrier 30, and the top surface of the second device body 38, if any, and provides an even and smooth top surface. The thermal interface layer 24 may be formed of a film or a paste with a thickness between 10 µm and 50 µm after it is formed. It is desired to have a thin thermal interface layer 24 to reduce thermal resistance.

The heat spreader 22 resides over the top surface of the thermal interface layer 24, so as to be close to the top surface of each first device die 12 and the top surface of the second device die 14. As such, the heat spreader 22 can efficiently dissipate the heat generated by the first device dies 12 and the second device die 14. The heat spreader 22 may be formed of copper, aluminum, or silver diamond.

FIGS. 2A-2B illustrate a cross-section view and a 3D view of an exemplary combined wafer 42, which is provided for forming the package architecture 10. The combined wafer 42 includes a device wafer 26W, a carrier wafer 30W, and an attachment region 28R between the device wafer 26W and the carrier wafer 30W. Typically, the carrier wafer 30W has a larger or a same plane size compared to the device wafer 26W, and the device wafer 26W confines within periphery of the carrier wafer 30W. In addition, the attachment region 28R has a larger or a same plane size compared to the device wafer 26W.

The device wafer 26W includes multiple device components (not shown, such as diodes, capacitors, resistors, and/or inductors) and may be formed of a III-V material, such as gallium arsenide or gallium nitride. The carrier wafer 30W may be formed of a material with a coefficient of thermal expansion (CTE) similar to that used in the device wafer 26W, such as silicon carbide, aluminum nitride. Also, the carrier wafer 30W may be formed of silicon, copper, aluminum, silicon carbide, steel, or Kovar, if proper attachment method is used. The device wafer 26W may have a thickness between 5 µm and 130 µm or between 5 µm and 100 µm, and the carrier wafer 30W may have a thickness between 100 µm and 300 µm that depends on thicknesses of other devices (e.g. the second device die 14) inside the final product. Compared to the device wafer 26W alone, the combined wafer 42, which may have a thickness between 125 µm and 350 µm, has a better mechanical rigidity and robustness, and less prone to breakage during the subsequent manufacturing processes.

FIGS. 3A-6F show different wafer-level fabricating processes, each of which illustrates steps to provide the combined wafer 42 shown in FIG. 2A.

In one embodiment, the carrier wafer 30W is first provided, as illustrated in FIG. 3A. The attachment region 28R, which may be the epoxy layer 32 with a thickness between 25 µm and 75 µm, is formed over the carrier wafer 30W, as illustrated in FIG. 3B. The epoxy layer 32 may be formed by an epoxy screening process or a film. Next, the device wafer 26W is attached to the carrier wafer 30W via the epoxy layer 32 to complete the combined wafer 42, as illustrated in FIG. 3C. The attachment of the device wafer 26W may be provided by a vacuum attach process to remove air trapped between the device wafer 26W and the epoxy layer 32, then by a heat and pressure process to cure the epoxy material and form a rigid three-piece structure.

In one embodiment, the carrier wafer 30W is provided, as illustrated in FIG. 4A, and then the epoxy layer 34 is formed over the carrier wafer 30W, as illustrated in FIG. 4B. The epoxy layer 34 may be formed by an epoxy screening process or a film. The device wafer 26W is also provided, as illustrated in FIG. 4C, and then the metal layer 33 is formed underneath the device wafer 26W, as illustrated in FIG. 4D. The metal layer 33 may be formed by a metallization process, such as spluttering or plating. Next, the metal layer 33 is connected to the epoxy layer 34, such that the device wafer 26W is attached to the carrier wafer 30W to complete the combined wafer 42, as illustrated in FIG. 4E. A combination of the metal layer 33 and the epoxy layer 34 forms the attachment region 28R. The connection of the metal layer 33 and the epoxy layer 34 may be provided by a vacuum attach process to remove air trapped between the metal layer 33 and the epoxy layer 34, and followed by a pressure and heat process to cure the epoxy layer 34. Herein, the metal layer 33 may be formed of gold or copper with a thickness between 0.5 µm and 3 µm, and the epoxy layer 34 may have a thickness between 25 µm and 75 µm. Relative thicker epoxy material is selected to compensate for a greater difference in CTE, to reduce warpage after bonding.

In one embodiment, the carrier wafer 30W is provided, as illustrated in FIG. 5A, and then the second metal layer 35B is formed over the carrier wafer 30W, as illustrated in FIG. 5B. The second metal layer 35B may be formed by a metallization process. The device wafer 26W is also provided, as illustrated in FIG. 5C, and then the first metal layer 35A is formed underneath the device wafer 26W, as illustrated in FIG. 5D. The first metal layer 35A may be formed by a same or another metallization process as for the second metal layer 35B. The first metal layer 35A may be formed of gold with a thickness between 0.25 µm and 3 µm, and the second metal layer 35B may be formed of gold with a thickness between 0.25 µm and 3 µm. Next, the first metal layer 35A is connected to the second metal layer 35B, such that the device wafer 26W is attached to the carrier wafer 30W to complete the combined wafer 42, as illustrated in FIG. 5E. Herein, the connection of the first metal layer 35A and the second metal layer 35B may be provided by a diffusion bonding process, involving pressure and heat. The first metal layer 35A and the second metal layer 35B merge into one metal layer 35 with a thickness between 0.5 µm and 6 µm (by diffusion) to form the attachment region 28R.

In one embodiment, the carrier wafer 30W is provided, as illustrated in FIG. 6A, and then the second metal layer 36B is formed over the carrier wafer 30W, as illustrated in FIG. 6B. The second metal layer 36B may be formed by a metallization process. After the second metal layer 36B is formed, the adhesive layer 37 is applied over the second metal layer 36B, as illustrated in FIG. 6C. The device wafer 26W is also provided, as illustrated in FIG. 6D, and then the first metal layer 36A is formed underneath the device wafer 26W, as illustrated in FIG. 6E. The first metal layer 36A may be provided by a same or another metallization process as for the second metal layer 36B. Herein, the first metal layer 36A may be formed of gold with a thickness between 0.5 µm and 3 µm, the second metal layer 36B may be formed of gold with a thickness between 0.5 µm and 3 µm, and the adhesive layer 37 may be a film of gold tin with a thickness between 25 µm and 75 µm. Next, the first metal layer 36A, the adhesive layer 37, and the second metal layer 36B are connected together, such that the device wafer 26W is attached to the carrier wafer 30W to complete the combined wafer 42, by a vacuum reflow process (heat only, no pressure) as illustrated in FIG. 6F. Herein, a combination of the first metal layer 36A, the adhesive layer 37, and the second metal layer 36B forms the attachment region 28R. The connecting step of the first metal layer 36A, the adhesive layer 37, and the second metal layer 36B may be provided by a heating process (around 300° C.) to melt the adhesive layer 37 for forming a metallic joint.

Notice that the gold to epoxy bond (e.g. the metal layer 33 connected to the epoxy layer 34) is a low temperature process. The gold to gold bond (e.g. the first metal layer 35A connected to the second metal layer 35B) has the highest thermal conductivity, but requires higher compression force. The gold to gold/tin bond (e.g. the first metal layer 36A connected to the adhesive layer 37) has lower compression force, but higher process temperature. Depending on the device sizes and/or the amount of heat to be dissipated, proper materials and/or proper one or more bonding methods can be selected.

Figure 7:
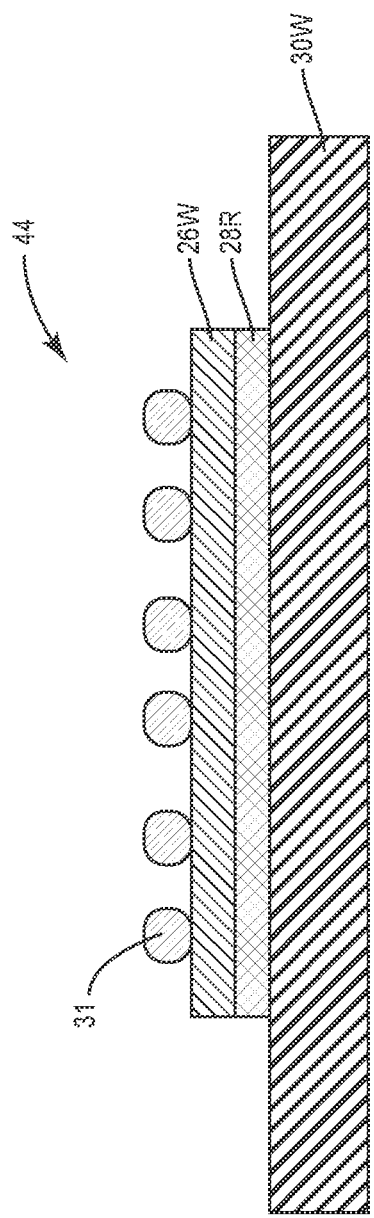

FIGS. 7-14 show an exemplary fabricating and packaging process that illustrates steps to provide the package architecture 10 shown in FIG. 1. Once the combined wafer 42 is complete, wafer bumping is proceeded to form the first bumps 31 over the combined wafer 42 so as to provide a precursor wafer structure 44, as illustrated in FIG. 7. Herein, the first bumps 31 are formed over the device wafer 26W, such that the first bumps 31 and the carrier wafer 30W are located on opposite surfaces of the device wafer 26W. The first bumps 31 may be solder balls (or columns, redistribution layers, not shown). In one embodiment, a lithography process may be utilized during wafer bumping to add the first bumps 31. Because the combined wafer 42 is thick enough (e.g. between 125 μm and 350 μm) and provides superior mechanical robustness, forming the first bumps 31 and the other subsequent processes, will not cause breakage of the thin device wafer 26W.

Figure 8:
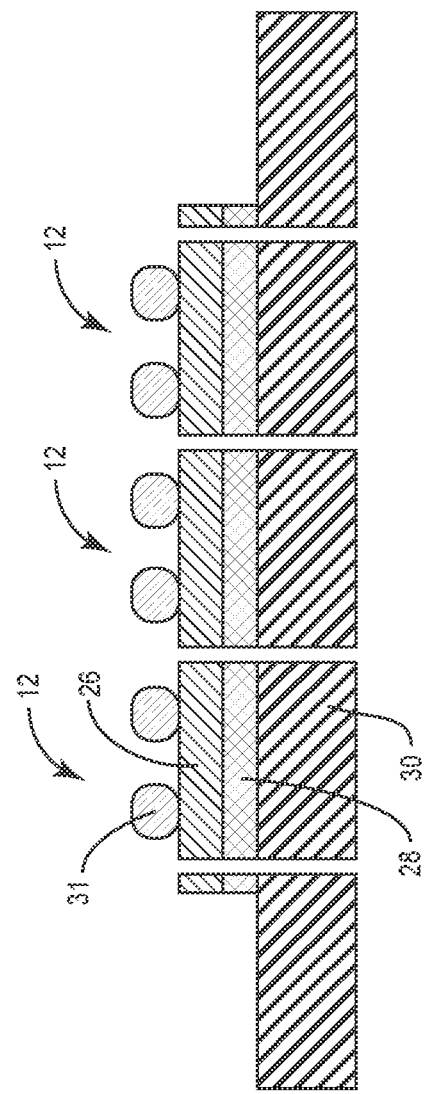

The precursor wafer structure 44 is then singulated into a number of the first device dies 12, as illustrated in FIG. 8. Each first device die 12 includes the first device body 26, the die carrier 30, the attachment section 28 between the first device body 26 and the die carrier 30, and several first bumps 31 over the first device body 26. Herein, each first device body 26 is formed by singulating the device wafer 26W, such that each first device body 26 includes one or more device components (not shown, such as a diode, a transistor, transmission line(s), a capacitor, a resistor, and/or an inductor). Each die carrier 30 is formed by singulating the carrier wafer 30W and each attachment section 28 is formed by singulating the attachment region 28R. Since the device wafer 26W does not have a larger plane size than the attachment region 28R and the carrier wafer 30W, each singulated first device body 26 confines within periphery of a corresponding attachment section 28 and periphery of a corresponding die carrier 30. Because the combined wafer 42 is thick enough (e.g. between 125 μm and 350 μm) and provides superior mechanical robustness, the singulating step will not introduce deformation to the singulated first device dies 12.

Next, two of the singulated first device dies 12 and the second device die 14 are mounted on the top surface of the package carrier 16, as illustrated in FIG. 9. In different applications, there might be more or fewer first device dies 12, and more or fewer second device dies 14 mounted on the package carrier 16. The second device die 14 may be fabricated in a different process compared to the first device dies 12. The second device die 14 includes the second device body 38 and the second bumps 40 underneath the second device body 38. The second device body 38 includes one or more device components (not shown, such as a diode, a capacitor, a resistor, and/or an inductor) and may be formed of silicon. Typically, the first device body 26 of each first device die 12 and the second device body 38 of the second device die 14 include different materials. The second device body 38 with a thickness between 125 μm and 350 μm is significantly thicker than the first device body 26.

Notice that, because the first device dies 12 and the second device die 14 are thick enough (e.g. between 125 μm and 350 μm) and can provide superior mechanical robustness, the mounting step will not introduce deformation or damage to the first device dies 12 and the second device die 14. Herein, the first bumps 31 of each first device die 12 are connected to the top surface of the package carrier 16, the first device body 26 resides over the first bumps 31, the attachment section 28 resides over the first device body 26, and the die carrier 30 resides over the attachment section 28. As such, the die carrier 30 is a backside of each first device die 12. The second bumps 40 may be solder balls and are connected to the top surface of the package carrier 16, and the second device body 38 resides over the second bumps 40. As such, the second device body 38 is at a top portion of the second device die 14.

In one embodiment, the underfilling material 20 is applied to encapsulate the first bumps 31 and the second bumps 40, as illustrated in FIG. 10. The underfilling material 20 fills the gap between the bottom surface of the first device body 26 of each first device die 12 and the top surface of the package carrier 16 and the gap between a bottom surface of the second device body 38 of the second device die 14 and the top surface of the package carrier 16.

Figure 11:
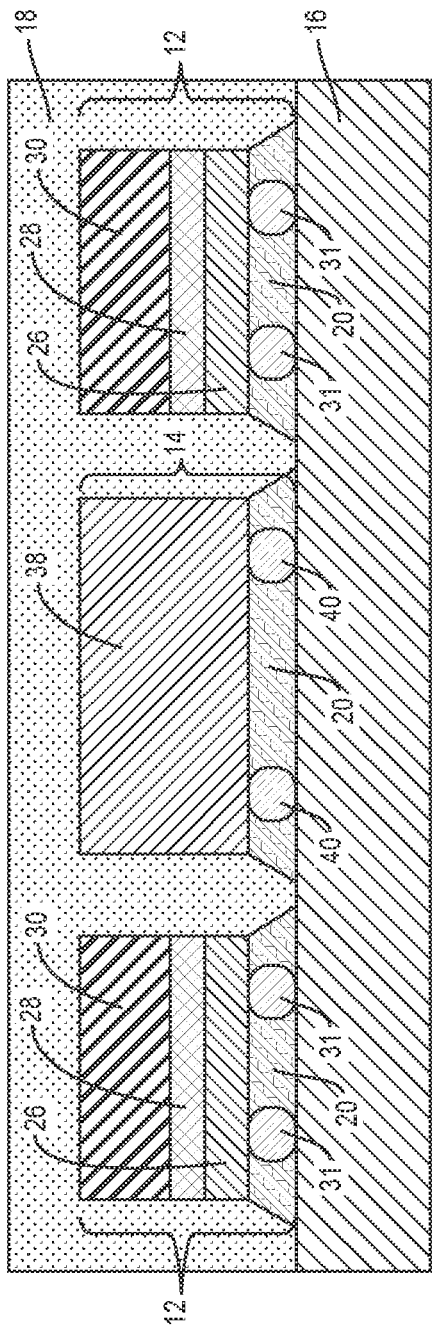

After the underfilling material 20 is applied, the mold compound 60 is applied over the top surface of the package carrier 16 to encapsulate the first device dies 12 and the second device die 14, as illustrated in FIG. 11. The mold compound 18 may be applied by various procedures, such as sheet molding, overmolding, compression molding, transfer molding, dam fill encapsulation, or screen print encapsulation. The mold compound 18 may be formed of the same or different material as the underfilling material 20. The mold compound 18 may be an organic epoxy resin system or the like.

In some applications, the underfilling material 20 is omitted. The mold compound 18 is also applied to encapsulate the first bumps 31 and the second bumps 40, and fill the gap between the bottom surface of the first device body 26 and the top surface of the package carrier 16 and the gap between the bottom surface of the second device body 38 and the top surface of the package carrier 16. Notice that, because the first device dies 12 and the second device die 14 are thick enough (e.g. between 125 μm and 350 μm) and can provide superior mechanical robustness, either the underfilling step or the molding step will not introduce deformation to the first device dies 12 and the second device die 14. Both the first device dies 12 and the second device die 14 are strong enough to withstand the molding/underfilling pressure.

Figure 12:
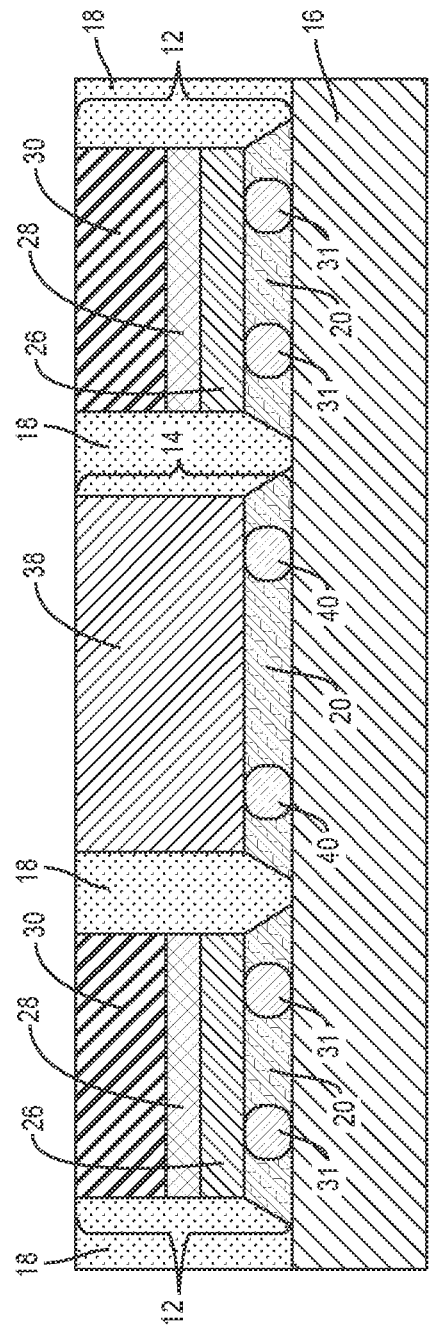

A curing process (not shown) is followed to harden the mold compound 18. The curing temperature is between 100° C. and 220° C. depending on which material is used for the mold compound 18. Next, the mold compound 18 is thinned down to expose both the backside (the die carrier 30) of each first device die 12 and the backside (the second device body 38) of the second device die 14, as illustrated in FIG. 12.

After the thinning step, the top surface of the (remaining) die carrier 30 of each first device die 12, the top surface of the (remaining) second device body 38 of the second device die 14, and a top surface of the remaining mold compound 18 are substantially coplanar. Coplanar surfaces refer to surfaces having a roughness tolerance less than 30 µm. When the thinning step is provided by a mechanical grinding process, the die carrier 30 of each first device die 12 may be formed of silicon to match the material of the second device body 38. As such, the die carrier 30 of each first device die 12, the second device body 38 of the second device die 14, and the mold compound 18 may have similar softness, so that an even combined surface (a combination of the top surface of each die carrier 30, the top surface of the second device body 38, and the top surface of the mold compound 18) can be easily obtained by grinding. In case the die carrier 30 is not formed of the same material as the second device body 38, such as aluminum, copper, aluminum nitride, it is necessary to select a proper starting thickness of the die carrier 30, such that the overall height of each first device die 12 is lower than the second device die 14, to minimize the grinding of dis-similar materials.

Figure 13:
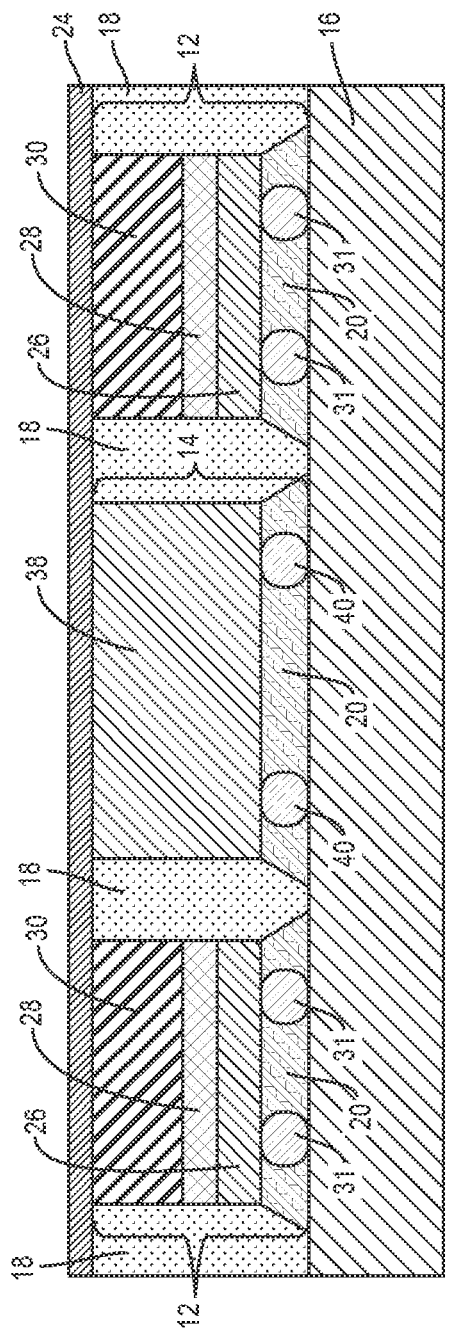

The thermal interface layer 24 is the formed over the top surface of the mold compound 18, over the top surface of the die carrier 30 of each first device die 12, and over the top surface of the second device body 38 of the second device die 14, as illustrated in FIG. 13. The thermal interface layer 24 may further planarize the level difference among the top surface of the mold compound 18, the top surface of each die carrier 30, and the top surface of the second device body 38, if any. The top surface of the thermal interface layer 24 is an even and smooth surface. The thermal interface layer 24 may be formed of a film or a paste.

Figure 14:
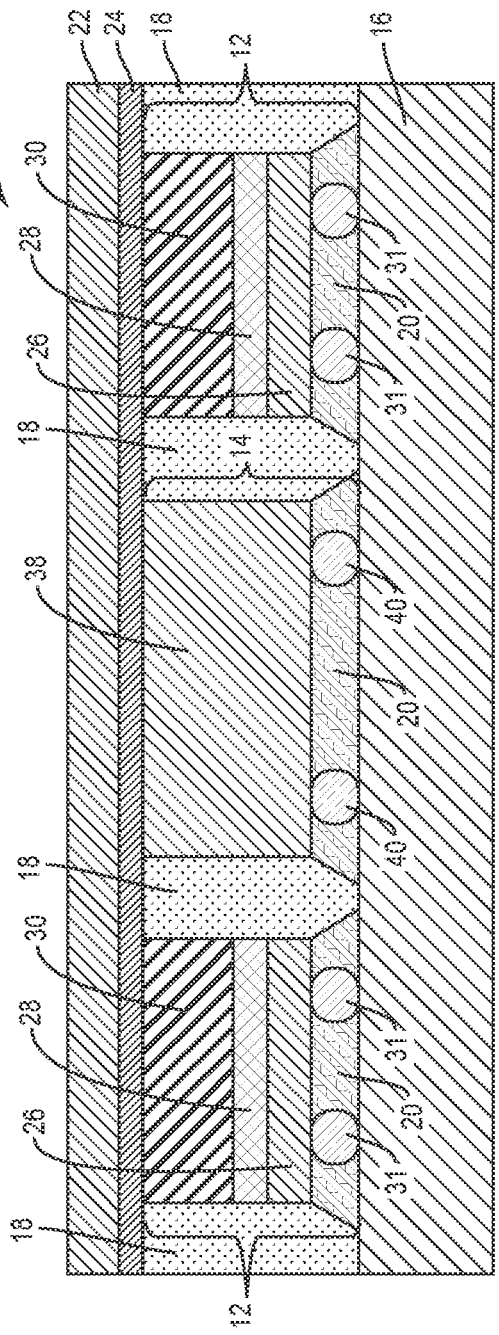

At last, the heat spreader 22 is applied over the top surface of the interface layer 24, as illustrated by FIG. 14. Herein, the heat spreader 22 is close to the top surface of each first device die 12 and the top surface of the second device die 14. As such, the heat spreader 22 can efficiently and simultaneously dissipate the heat generated by the first device dies 12 and the second device die 14. The heat spreader 22 may be formed of copper, aluminum, or silver diamond. The heat spreader 22 may be formed under pressure to maintain uniformity of its surface and consistency of the overall height.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    singulating a precursor wafer structure into a plurality of first device dies, each of which includes a first device body, a die carrier, an attachment section between the first device body and the die carrier, and a plurality of first bumps connected to the first device body;
    mounting at least one of the plurality of first device dies and a second device die on a package carrier, wherein:
    the plurality of the first bumps is connected to a top surface of the package carrier; and
    the second device die includes a second device body and a plurality of second bumps that are underneath the second device body and connected to the top surface of the package carrier;
    applying a mold compound over the top surface of the package carrier to encapsulate the at least one of the plurality of first device dies and the second device die; and
    thinning the mold compound down to expose both the die carrier of the at least one of the plurality of first device dies and the second device body of the second device die, such that, after thinning, a top surface of the die carrier, a top surface of the second device body, and a top surface of the mold compound are substantially coplanar.

2. The method of claim 1 further comprising applying a heat spreader over the top surface of the die carrier, the top surface of the second device body, and the top surface of the mold compound.

3. The method of claim 2 wherein the heat spreader is formed of copper, aluminum, or silver diamond.

4. The method of claim 2 further comprising, before applying the heat spreader, applying a thermal interface layer over the top surface of the die carrier, the top surface of the second device body, and the top surface of the mold compound, wherein the heat spreader is applied over the thermal interface layer.

5. The method of claim 1 wherein:
    the precursor wafer structure comprises a device wafer with a thickness between 5 µm and 30 µm, a carrier wafer, an attachment region between the device wafer and the carrier wafer, and the first bumps connected to the device wafer, wherein the first bumps and the carrier wafer are located on opposite surfaces of the device wafer; and
    the first device body of each of the plurality of first device dies is formed by the device wafer singulation, the die carrier of each of the plurality of first device dies is formed by the carrier wafer singulation, and the attachment section of each of the plurality of first device dies is formed by the attachment region singulation.

6. The method of claim 5 wherein the carrier wafer has a thickness between 100 µm and 300 µm.

7. The method of claim 5 wherein the device wafer and the second device body comprise different materials.

8. The method of claim 7 wherein:
    the carrier wafer is formed of silicon, copper, aluminum, or aluminum nitride;
    the device wafer comprises a III-V material; and
    the second device body comprises silicon.

9. The method of claim 8 wherein the device wafer comprises gallium arsenide or gallium nitride.

10. The method of claim 7, wherein thinning the mold compound down is provided by a mechanical grinding process.

11. The method of claim 10 wherein:
    the carrier wafer is formed of silicon;
    the device wafer comprises a III-V material; and
    the second device body comprises silicon.

12. The method of claim 5 wherein forming the precursor wafer structure comprises:
    providing the carrier wafer;
    forming the attachment region, which comprises an epoxy layer with a thickness between 25 µm and 75 µm, over the carrier wafer;

attaching the device wafer to the carrier wafer via the epoxy layer, and forming the first bumps over the device wafer, such that the first bumps and the epoxy layer are located on the opposite surfaces of the device wafer.

13. The method of claim 12 wherein:

forming the epoxy layer is provided by an epoxy screening process; and attaching the device wafer to the carrier wafer is provided by a vacuum attach process to remove air trapped between the device wafer and the epoxy layer, and a pressure and heat process to cure the epoxy layer.

14. The method of claim 5 wherein forming the precursor wafer structure comprises:

providing the device wafer;

forming a metal layer underneath the device wafer;

providing the carrier wafer;

forming an epoxy layer over the carrier wafer;

connecting the metal layer to the epoxy layer, such that the device wafer is attached to the carrier wafer, wherein the metal layer and the epoxy layer form the attachment region; and forming the first bumps over the device wafer, such that the first bumps and the metal layer are located on the opposite surfaces of the device wafer.

15. The method of claim 14 wherein:

forming the metal layer is provided by a metallization process;

forming the epoxy layer is provided by an epoxy screening process; and connecting the metal layer to the epoxy layer is provided by a vacuum attach process to remove air trapped between the metal layer and the epoxy layer, and a pressure and heat process to cure the epoxy layer.

16. The method of claim 14 wherein the metal layer is formed of gold or copper with a thickness between 0.5 µm and 3 µm, and the epoxy layer has a thickness between 25 µm and 75 µm.

17. The method of claim 5 wherein forming the precursor wafer structure comprises:

providing the device wafer;

forming a first metal layer underneath the device wafer;

providing the carrier wafer;

forming a second metal layer over the carrier wafer;

connecting the first metal layer to the second metal layer, such that the device wafer is attached to the carrier wafer, wherein the first metal layer and the second metal layer merge into one metal layer to form the attachment region; and forming the first bumps over the device wafer, such that the first bumps and the metal layer are located on the opposite surfaces of the device wafer.

18. The method of claim 17 wherein:

forming the first metal layer is provided by a metallization process;

forming the second metal layer is provided by another metallization process; and connecting the first metal layer to the second metal layer is provided by a diffusion bonding process.

19. The method of claim 17 wherein the first metal layer is formed of gold with a thickness between 0.25 µm and 3 µm, and the second metal layer has a thickness between 0.25 µm and 3 µm.

20. The method of claim 5 wherein forming the precursor wafer structure comprises:

providing the device wafer;

forming a first metal layer underneath the device wafer;

providing the carrier wafer;

forming a second metal layer over the carrier wafer;

applying an adhesive layer over the second metal layer;

connecting the first metal layer, the adhesive layer, and the second metal layer together, such that the device wafer is attached to the carrier wafer, wherein the first metal layer, the adhesive layer, and the second metal layer form the attachment region; and forming the first bumps over the device wafer, such that the first bumps and the first metal layer are located on the opposite surfaces of the device wafer.

21. The method of claim 20 wherein:

forming the first metal layer is provided by a metallization process;

forming the second metal layer is provided by another metallization process; and connecting the first metal layer to the adhesive layer is provided by a vacuum reflow process.

22. The method of claim 20 wherein the first metal layer is formed of gold with a thickness between 0.5 µm and 3 µm, the second metal layer is formed of gold with a thickness between 0.5 µm and 3 µm, and the adhesive layer is formed of gold tin with a thickness between 25 µm and 75 µm.

23. The method of claim 1 further comprising, before applying the mold compound, applying an underfilling material to encapsulate the plurality of first bumps and the plurality of second bumps, and to fill gaps between the first device body and the top surface of the package carrier and between the second device body and the top surface of the package carrier.

* * * * *